United States Patent
Lin

(10) Patent No.: US 9,197,203 B2
(45) Date of Patent: Nov. 24, 2015

(54) CYCLE MODULATION CIRCUIT FOR LIMITING PEAK VOLTAGE AND ASSOCIATED POWER SUPPLY

(75) Inventor: Kuo-Fan Lin, Taoyuan Hsien (TW)

(73) Assignee: FSP TECHNOLOGY INC., Taoyuan Dist., Taoyuan (TW)

( * ) Notice: Subject to any disclaimer, the term of this patent is extended or adjusted under 35 U.S.C. 154(b) by 952 days.

(21) Appl. No.: 12/603,119

(22) Filed: Oct. 21, 2009

(65) Prior Publication Data

US 2010/0039839 A1    Feb. 18, 2010

Related U.S. Application Data

(63) Continuation-in-part of application No. 11/599,290, filed on Nov. 15, 2006, now abandoned.

(51) Int. Cl.
| | |
|---|---|
| H03K 3/017 | (2006.01) |
| H03K 7/08 | (2006.01) |
| H02M 3/156 | (2006.01) |
| H02M 3/335 | (2006.01) |
| H02M 1/00 | (2007.01) |

(52) U.S. Cl.
CPC ................ *H03K 7/08* (2013.01); *H02M 3/156* (2013.01); *H02M 3/33507* (2013.01); *H02M 2001/0016* (2013.01)

(58) Field of Classification Search
CPC ........... H03K 7/08; H03K 3/284; H03K 5/04; H03K 5/1565; H03K 5/13
USPC ............ 327/157, 282–288, 172, 175; 363/49; 323/282–288
See application file for complete search history.

(56) References Cited

U.S. PATENT DOCUMENTS

| | | | |
|---|---|---|---|
| 4,086,888 A | 5/1978 | Roberts | |
| 4,359,679 A * | 11/1982 | Regan | ........................... 323/272 |
| 2005/0017764 A1 | 1/2005 | Feldtkeller | |

* cited by examiner

*Primary Examiner* — Diana J Cheng
(74) *Attorney, Agent, or Firm* — Winston Hsu; Scott Margo

(57) ABSTRACT

A cycle modulation circuit for limiting voltage peak value of a power supply employed an active clamp. The power supply receives an input power which is modulated through a power driving unit to become a driving power transformed through a transformer to be output. The cycle modulation circuit includes a comparison unit and a linear voltage generation unit. The comparison unit receives the input power to generate a level signal which is used as a base value to compare level with an oscillation signal generated by the linear voltage generation unit, thereby to modulate and output a pulse width limit signal with a composite cycle consisting of a high level and a low level. The pulse width limit signal is input to the power driving unit to limit the peak value of the driving power modulated by the power driving unit.

5 Claims, 6 Drawing Sheets

US 9,197,203 B2

CYCLE MODULATION CIRCUIT FOR LIMITING PEAK VOLTAGE AND ASSOCIATED POWER SUPPLY

This application is a continuation-in-part, and claims priority, of from U.S. patent application Ser. No. 11/599,290 filed on Nov. 15, 2006 now abandoned, entitled "CYCLE MODULATION CIRCUIT CAPABLE OF LIMITING PEAK VOLTAGE".

FIELD OF THE INVENTION

The present invention relates to a cycle modulation circuit for limiting peak voltage and particularly to a cycle modulation circuit that uses a level signal generated by an input voltage source as a base value to compare with an oscillation signal generated by a linear voltage generation unit to produce a pulse width limit signal to limit the peak value of driving power.

BACKGROUND OF THE INVENTION

Power supply is an indispensable element on many information products. Its most important mission is to provide sufficient and stable voltage. Without this equipment cannot be started normally, and unpredictable voltage and current surges could take place to cause damage of the equipment.

The conventional power supply controls the duty cycle of a power driving unit by inputting a voltage through a pulse width modulation (PWM) circuit. By controlling the switch conduction cycle of the power driving unit, the peak-to-peak value of driving power can be regulated. The driving power is the voltage at two ends of the primary coil of the transformer in the power supply. The peak value and cycle of the driving power greatly affect output of the power supply. If the peak-to-peak value (Vpp) of the driving power generated by the power driving unit cannot be properly controlled or output error is excessive, the peripheral devices and semiconductor elements at the rear end could be damaged. To prevent such problems from happening, higher voltage-resistant semiconductor elements have to be used. As a result, the cost is higher. Hence controlling the peak-to-peak value (Vpp) of the driving power is an important research issue of power supply.

One of the conventional control methods that is widely adopted to control the PWM circuit is "voltage second tracking method". It is based on a principle that during power conversion multiplication product of voltage and second is equal. Hence by tracking alterations of the driving power, and feeding back the driving power to the PWM circuit, the PWM circuit can regulate the duty cycle through the feedback voltage to stabilize the peak-to-peak value of the driving power. In practice, the voltage second tracking method uses two oscillators to independently control the cycle and voltage second. The oscillators consist of various elements such as resistors and capacitors. In practice, these elements have different characteristics and cannot be totally the same even made with same specifications. Every element has its error. As a result, the oscillators are not as accurate as desired and do not fully conform to their specifications. The error of the cycle and voltage second respectively controlled by the two oscillators are especially obvious. Hence there is always an error on the duty cycle output by the PWM circuit compared with that derived in the ideal condition. Without a mechanism to ensure the alteration range, the peak-to-peak value of the driving power output by the power driving unit is unstable. And the duty voltage with a constant peak value is not achievable. In the event that a transient surge or great load variation takes place, it could be mistakenly interpreted by the PWM circuit to generate a high voltage, and the rear end circuit or load could be damaged. To protect the safety of the circuit and load, more expensive high voltage-resistant semiconductor elements have to be used on the rear end circuit. It is not economic effective.

SUMMARY OF THE INVENTION

Therefore, the primary object of the present invention is to limit the controllable maximum duty cycle of pulse width modulation circuits to stabilize the peak-to-peak value of driving power.

The present invention provides a cycle modulation circuit to limit the voltage peak value that is used on a power supply employed an active clamp. The power supply has a power driving unit which includes a PWM circuit to generate a PWM signal. The power driving unit is connected to an input voltage source to receive input power. The input power is modulated to become a driving power according to the PWM signal, and the driving power is sent to the primary side winding of the transformer of the power supply. The cycle modulation circuit includes a comparison unit and a linear voltage generation unit. The comparison unit has two signal input ends and a signal output end to output a pulse width limit signal. One of the signal input ends is electrically connected to the input voltage source to receive a level signal representing the voltage value of the input power. The linear voltage generation unit generates an oscillation signal of a linear voltage value sent to another signal input end of the comparison unit. The comparison unit uses the level signal as a base value to compare level with the oscillation signal and perform modulation and output the pulse width limit signal which has a composite cycle consisting of a high level and a low level. The pulse width limit signal is input to the rear end power driving unit so that the PWM circuit thereof determines the allowable duty cycle within a limited voltage peak value range provided by the pulse width limit signal to limit the peak value of the driving power.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Please refer to FIGS. 1 through 6, the present invention provides a cycle modulation circuit to limit allowable maximum duty cycle of a power driving unit to limit peak-to-peak value of driving power.

Figure 1:
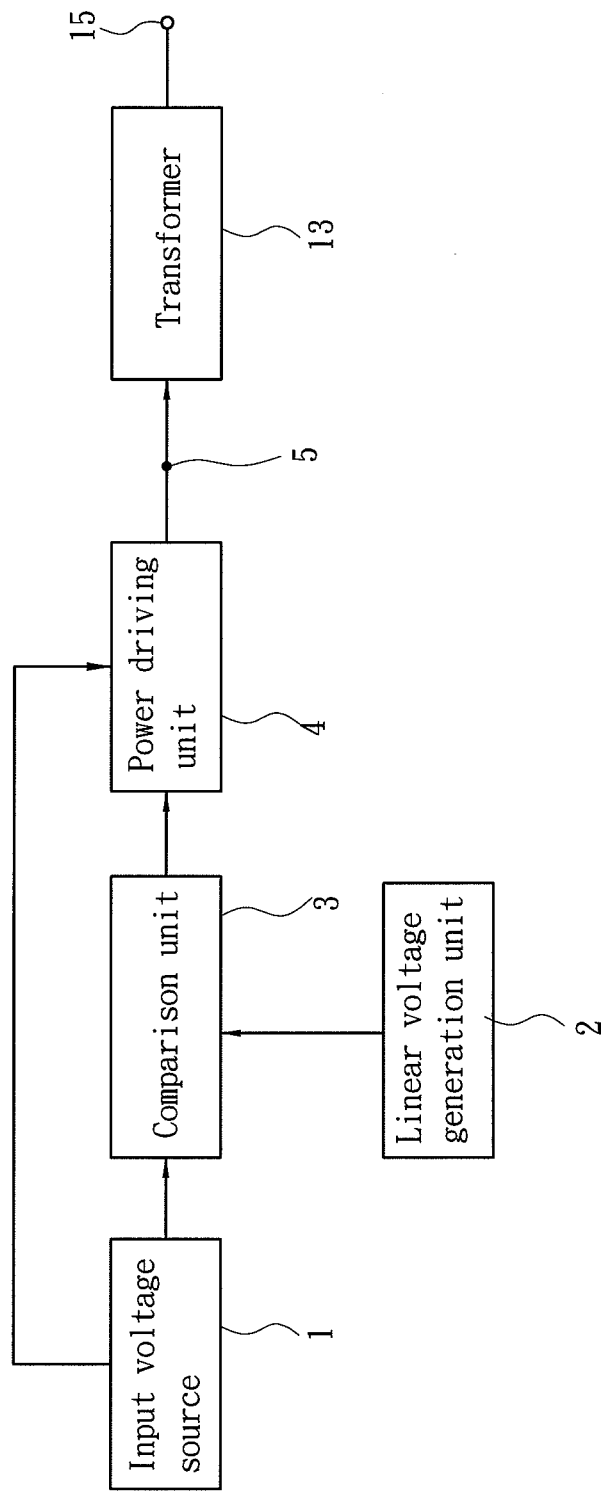
FIG. 1 is a circuit block diagram of the invention.
Figure 6:
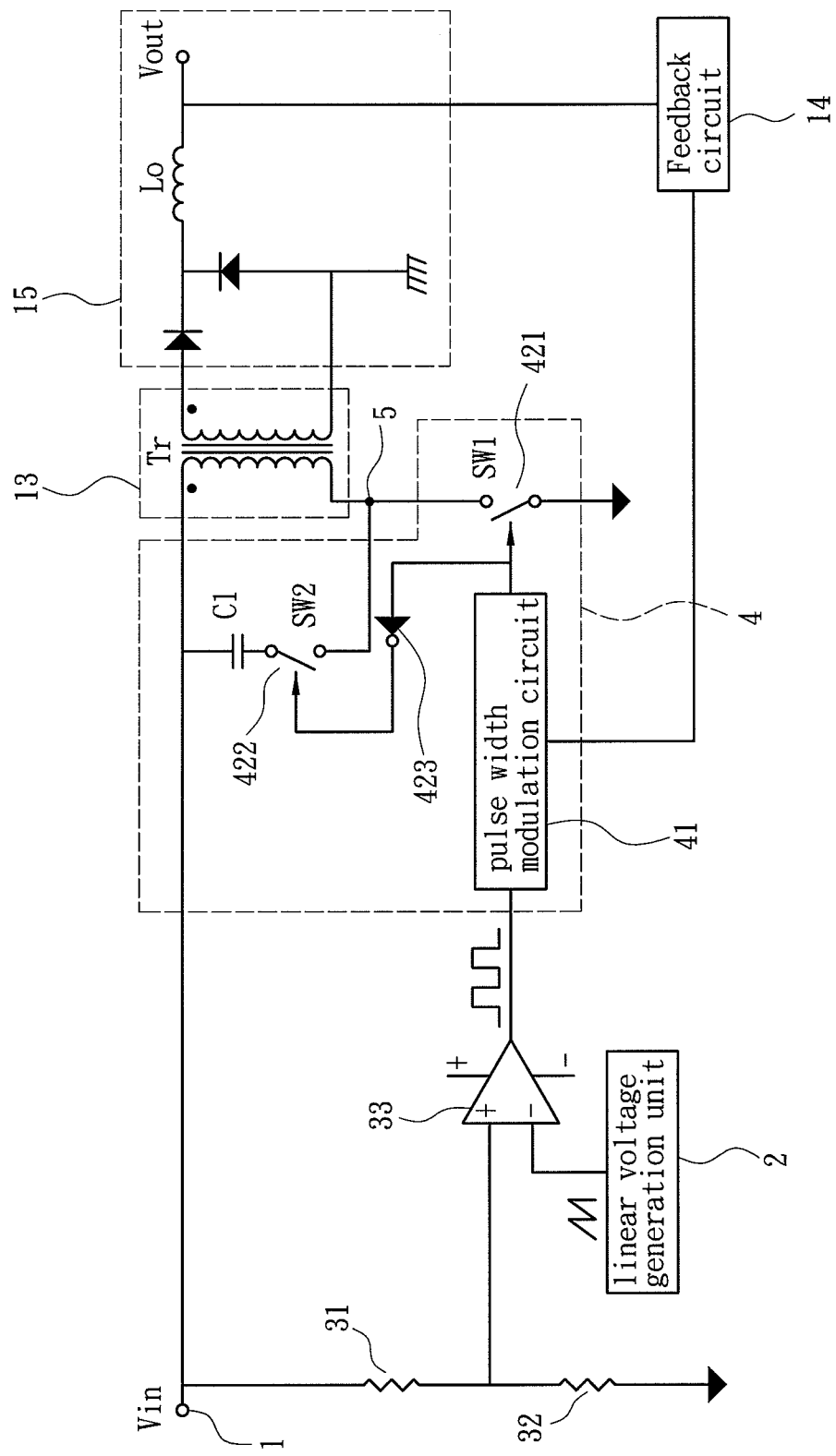
FIG. 6 is a schematic view of the circuit architecture of a power supply adopted the invention.

FIGS. 1 and 6 illustrate an embodiment of the invention adopted for use on a power supply. The power supply has a power driving unit 4 receive an input power from an input voltage source 1. The power driving unit 4 includes a pulse width modulation (PWM) circuit 41 which outputs a PWM signal to drive an active clamp. The active clamp has at least two switches 421 and 422 operating in opposite phases. To show the switches 421 and 422 operating in an opposite manner, an inverter 423 is added on the path of the switch 422 driven by the PWM signal. However, using the switches 421 and 422 is not the limitation of the invention to establish the opposite operation as long as the switches 421 and 422 do offer opposite operation and conform to active clamp operation mode. The active clamp modulates the input power to a driving power sent to the primary side winding of a transformer 13 of the power supply. Through induction of the secondary side winding of the transformer 13, an output power is output through an output unit 15. A feedback circuit 14 also is provided to connect the output unit 15 and the PWM circuit 41 to perform feedback control. As shown in FIGS. 1 and 6, there is a node 5 between the power driving unit 4 and the transformer 13. On the node 5, the driving power can be detected. The voltage of the driving power can also be applied on two ends of the switches 421 and 422. When the switches 421 and 422 are ON and OFF, they bear the voltage of the driving power. If the voltage of the driving power is greater than their allowable upper limit, the switches 421 and 422 could be damaged. The invention further provides a linear voltage generation unit 2 and a comparison unit 3. The comparison unit 3 has two signal input ends and a signal output end to output a pulse width limit signal 8. One of the signal input ends is electrically connected to the input voltage source 1 to receive a level signal 7 representing the voltage value of the input power. The linear voltage generation unit 2 generates an oscillation signal of a linear voltage value that is sent to another signal input end of the comparison unit 3. The comparison unit 3 compares the level signal 7 with the oscillation signal and generates the pulse width limit signal 8 that has a composite cycle consisting of a high level and a low level.

Figure 2:
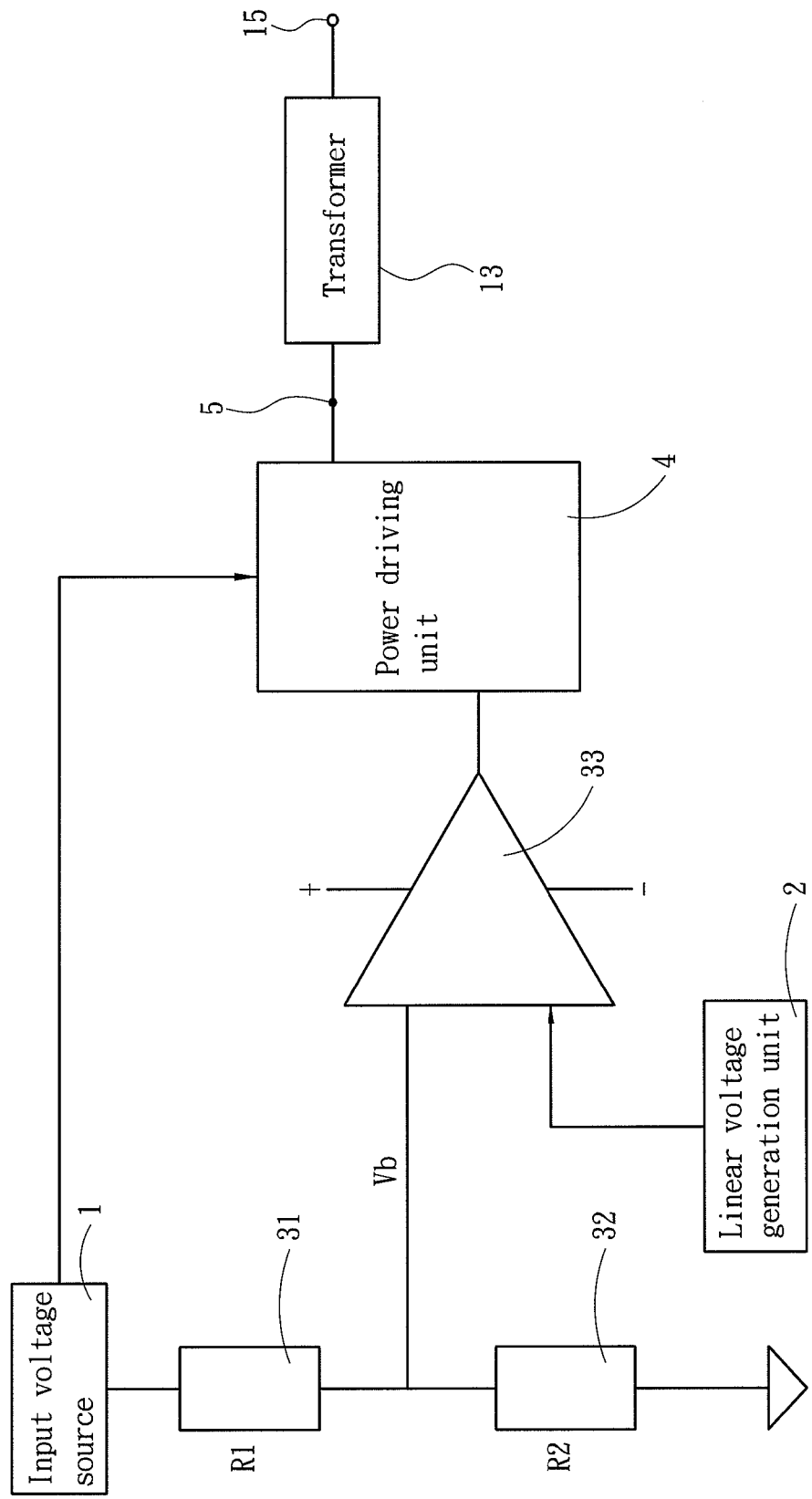
FIG. 2 is a schematic circuit diagram of the invention.

Referring to FIG. 2, the comparison unit 3 includes a voltage division unit and a comparator 33 having a signal input end and a signal output end. The voltage division unit consists of a first voltage division resistor 31 (R1) and a second voltage division resistor 32 (R2) to capture the level signal 7 (Vb) representing the voltage value of the input power from the input voltage source 1. The linear voltage generation unit 2 generates an oscillation signal 6 with a linear voltage sawteeth waveform. The comparator 33 compares the level signal 7 with the oscillation signal 6 to generate the pulse width limit signal 8 with the composite cycle consisting of a high level and a low level. The pulse width limit signal 8 is sent to the PWM circuit 41 of the power driving unit 4. The PWM circuit 41 determines an allowable duty cycle within a limited voltage peak value range provided by the pulse width limit signal 8 to limit the peak value of the driving power. Thus the driving power at the node 5 is limited to protect the switches 421 and 422 from being punctured by voltage.

Figure 3:
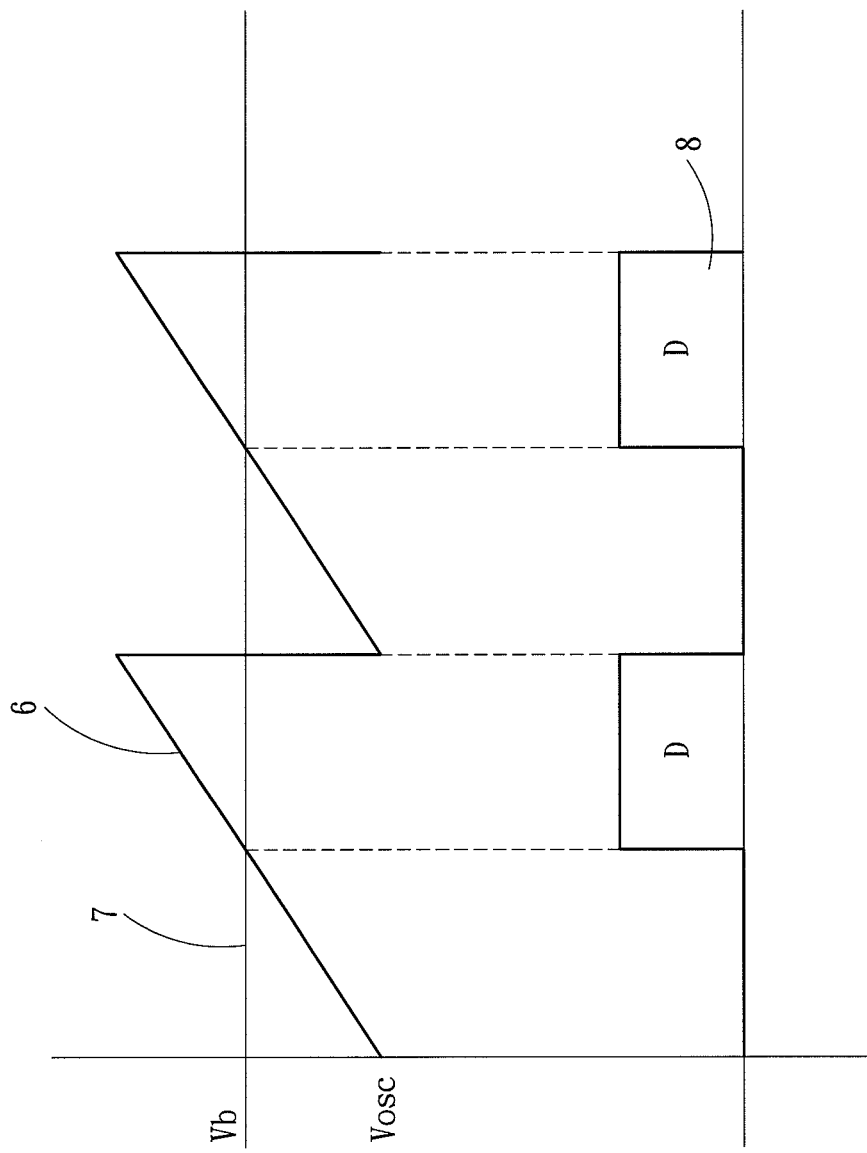
FIG. 3 is a schematic modulation chart of a pulse width limit signal.
Figure 4:
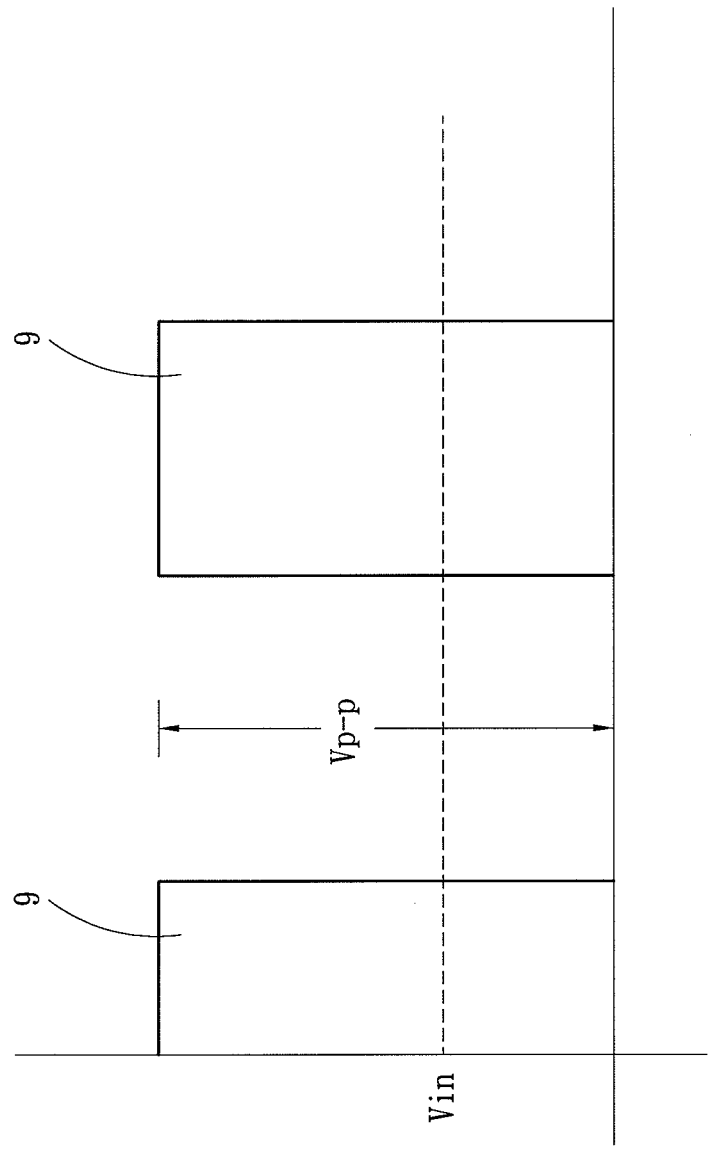
FIG. 4 is an output waveform chart of the power driving unit.

Refer to FIGS. 3 and 4 for waveform comparison and generation methods previously discussed. Calculation formula is performed as follow:

$$Vb=Vin \times R2/(R1+R2), \text{ wherein } Vin \text{ is gotten from the input voltage source 1}$$

The level signal 7 and the oscillation signal 6 (Vosc) generated by the linear voltage generation unit 2 are input respectively to the two signal input ends of the comparator 33 which compares the captured level signal 7 (Vb) and the oscillation signal 6 (Vosc) to generate the pulse width limit signal 8 with the composite cycle consisting of a high level and a low level. When the oscillation signal 6 (Vosc) is greater than the level signal 7 (Vb), the comparator 33 outputs the high level. Thus the input voltage value and the cycle width of the high level of the pulse width limit signal 8 are proportional in inverse. The pulse width limit signal 8 output from the comparator 33 affects the power driving unit 4 and limits the allowable maximum duty cycle thereof. Moreover, the pulse width limit signal 8 also affects the peak-to-peak value (Vp-p) of the driving power. Calculation formulas can be performed as follow:

$$Vb=Vin \times R2/(R1+R2) \quad (1)$$

$$D=1-Vb/Vosc \quad (2)$$

$$Vp\text{-}p=Vin(1/(1-D)) \quad (3)$$

By inducing (1) and (2) into (3), the outcome is:

$$Vp\text{-}p=Vosc(R1+R2)/R2=K$$

Wherein Vin comes from the input voltage source 1,
Vb is the level signal 7,
Vosc is the oscillation signal 6,
D is the high level cycle of the pulse width limit signal 8, and
K is a constant.

The calculation formulas set forth above indicate that once the oscillation signal 6 (Vosc) is controlled precisely, the maximum value of the peak-to-peak value (Vp-p) can be controlled as shown in FIG. 4 with an output signal 9. The pulse width limit signal 8 is determined by the level signal 7 (Vb) and the oscillation signal 6 (Vosc). The present technique can precisely control the peak value of the oscillation signal 6 (Vosc). Hence Vp-p can be fixed and limited at a maximum value. Namely, even if the level signal 7 (Vb) fluctuates constantly or surges, the maximum value of the driving power is not affected. Hence the driving power does not exceed the set range.

Figure 5:
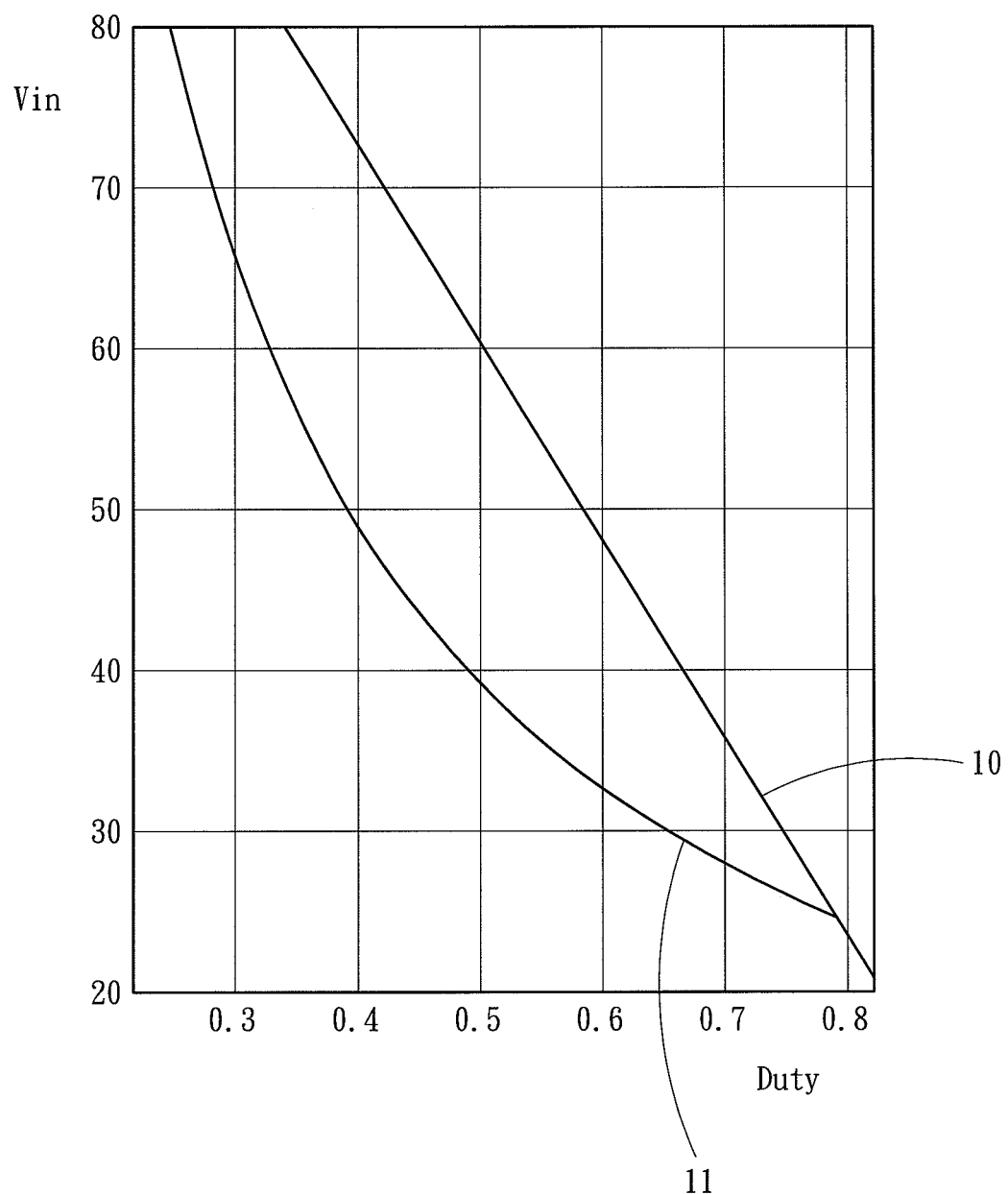
FIG. 5 is an input-cycle comparison chart.

Refer to FIG. 5 for the comparison chart of input and cycle that depicts the relationship of input and cycle of the driving power output from the power driving unit 4. The vertical coordinate indicates the input voltage, the horizontal coordinate indicates the ratio of conduction cycle. The lines represent alterations of input voltage and the conduction cycle. In order to stabilize the driving power output from the power driving unit 4, based on the voltage second tracking theory, the conduction cycle is regulated constantly through a feedback voltage to keep the voltage on the curve. Multiplication product of input and cycle is a constant. The line of input-cycle 11 of the work being generated is a curve. In practice, in the event that a surge or a transient voltage has an error according to the frequency, or the surge or transient condition could be mistakenly interpreted and result in the output exceeding the original setting curve and cause damage of the rear end of the circuit. The invention can control the maximum value of Vp-p precisely by controlling the oscillation signal 6 to generate an upper limit 10 of input-cycle. The input voltage value and alteration amount of the cycle width of the high level of the pulse width limit signal 8 form a linear relationship. The upper limit 10 of the input-cycle is a straight line which represents the maximum limitation of the driving power. In other words, whether fluctuation or surge occurs to the input voltage, the driving power always is controlled below the upper limit 10 of the input-cycle. The invention limits the allowable maximum conduction cycle of the pulse width limit signal 8 through the oscillation signal 6 and the level signal 7, thereby fixes a peak value of the driving voltage. As a result, design of the voltage-resistant elements can be done according to the upper limit of the peak value of the driving power to enhance circuit safety and reduce cost.

While the preferred embodiment of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

LEGEND FOR DRAWINGS

FIGS. 1, 2 and 6

1—Input voltage source
2—Linear voltage generation unit
3—Comparison unit
4—Power driving unit,
13—Transformer
14—Feedback circuit
41—Pulse width modulation circuit

What is claimed is:

1. A power supply, comprising:
   a cycle modulation circuit; and
   a power driving unit, wherein the cycle modulation circuit is to limit voltage peak value for the power supply employing an active clamp, the power driving unit includes a pulse width modulation (PWM) circuit to generate a PWM signal, the power driving unit is connected to an input voltage source to receive an input power and modulate the input power to become a driving power according to the PWM signal and send the driving power to a primary side winding of a transformer of the power supply, and the cycle modulation circuit comprises:
   a comparison unit which has two signal input ends and a signal output end to output a pulse width limit signal, one of the signal input ends being electrically connected to the input voltage source to receive a level signal representing a voltage value of the input power; and
   a linear voltage generation unit to generate an oscillation signal of a linear voltage value, and the oscillation signal is sent to another signal input end of the comparison unit;
   wherein the comparison unit treats the level signal as a base value to compare level with the oscillation signal to modulate and output the pulse width limit signal with a composite cycle consisting of a high level and a low level, the pulse width limit signal being sent to the power driving unit at a rear end so that the PWM circuit thereof determines an allowable duty cycle within a limited voltage peak value range provided by the pulse width limit signal to limit the peak value of the driving power.

2. The power supply of claim 1, wherein the input voltage source is connected to a voltage division unit to attenuate the level signal representing the input voltage value.

3. The power supply of claim 1, wherein the oscillation signal is generated by the linear voltage generation unit having a linear voltage sawtooth waveform with potential differences.

4. The power supply of claim 1, wherein the input voltage value is inverse proportional to the cycle width of the high level of the pulse width limit signal.

5. The power supply of claim 1, wherein the input voltage value is in a linear relationship with the alteration amount of the cycle width of the high level of the pulse width limit signal.

* * * * *